(12) United States Patent
Ota et al.

(10) Patent No.: US 9,733,299 B2
(45) Date of Patent: Aug. 15, 2017

(54) INSPECTION JIG

(71) Applicant: NIDEC-READ CORPORATION, Kyoto (JP)

(72) Inventors: Norihiro Ota, Kyoto (JP); Mitsunobu Tokimasa, Kyoto (JP); Kosuke Hirobe, Kyoto (JP); Kohei Tsumura, Kyoto (JP)

(73) Assignee: NIDEC-READ CORPORATION, Kyoto (JP)

( * ) Notice: Subject to any disclaimer, the term of this patent is extended or adjusted under 35 U.S.C. 154(b) by 213 days.

(21) Appl. No.: 14/530,850

(22) Filed: Nov. 3, 2014

(65) Prior Publication Data

US 2015/0123693 A1   May 7, 2015

(30) Foreign Application Priority Data

Nov. 7, 2013  (JP) .................................. 2013-230851

(51) Int. Cl.
*G01R 31/28*   (2006.01)
*G01R 1/073*   (2006.01)

(52) U.S. Cl.
CPC ..... *G01R 31/2808* (2013.01); *G01R 1/07357* (2013.01); *G01R 31/2801* (2013.01); *G01R 31/2886* (2013.01)

(58) Field of Classification Search
CPC ... G01R 1/0416; G01R 31/28; G01R 31/2808
See application file for complete search history.

(56) References Cited

U.S. PATENT DOCUMENTS 5,416,428 A * 5/1995 Swart ................. G01R 31/2801
                                                    324/750.16
6,005,405 A    12/1999 Slutz
(Continued)

FOREIGN PATENT DOCUMENTS

| JP | 2006258687 A | 9/2006 |
|----|--------------|--------|
| JP | 2009047512 A | 3/2009 |
| JP | 4974311 B1   | 7/2012 |

OTHER PUBLICATIONS

European Search Report issued for EP14190845.9 on Mar. 24, 2015.

*Primary Examiner* — Jermele M Hollington
*Assistant Examiner* — Alvaro Fortich
(74) *Attorney, Agent, or Firm* — Viering, Jentschura & Partner mbB

(57) ABSTRACT

An inspection jig may include a frame, an electrode body provided with electrodes, conductive contactors having a wire shape, a support block having a facing surface opposite to which an inspection circuit board is disposed, guiding one ends of the contactors to the inspection points of the circuit board mounted on the facing surface, guiding other ends to the electrodes, and configured to move relatively to the frame in a moving direction which crosses the facing surface, biasing parts configured to bias the support block in a direction moving away from the electrode body and close to the circuit board, and a regulating plate disposed between the support block and the frame so as to extend in a direction from the support block to the frame, having elasticity, and having regulation of deformation in a first direction which is parallel to the facing surface and which crosses the extending direction.

20 Claims, 11 Drawing Sheets

(56) References Cited

U.S. PATENT DOCUMENTS

| | | | | |
|---|---|---|---|---|
| 6,525,555 | B1* | 2/2003 | Khandros | G01R 31/2874 |
| | | | | 324/750.07 |
| 7,282,934 | B2* | 10/2007 | Mazza | G01R 1/07378 |
| | | | | 324/754.11 |
| 8,884,639 | B2* | 11/2014 | Anderson | G01R 31/2891 |
| | | | | 324/754.01 |
| 2004/0207423 | A1* | 10/2004 | Mizoguchi | G01R 31/2808 |
| | | | | 324/750.19 |
| 2004/0239351 | A1* | 12/2004 | Sawada | G01R 31/2887 |
| | | | | 324/750.22 |
| 2007/0178727 | A1* | 8/2007 | Igarashi | G01R 1/07314 |
| | | | | 439/91 |
| 2008/0284458 | A1* | 11/2008 | Hosaka | G01R 3/00 |
| | | | | 324/755.06 |
| 2011/0115514 | A1* | 5/2011 | Komatsu | G01R 1/06755 |
| | | | | 324/754.14 |
| 2011/0241721 | A1* | 10/2011 | Schroeter | G01R 31/2808 |
| | | | | 324/763.01 |
| 2013/0033278 | A1* | 2/2013 | Ohta | G01R 1/06722 |
| | | | | 324/750.25 |

* cited by examiner

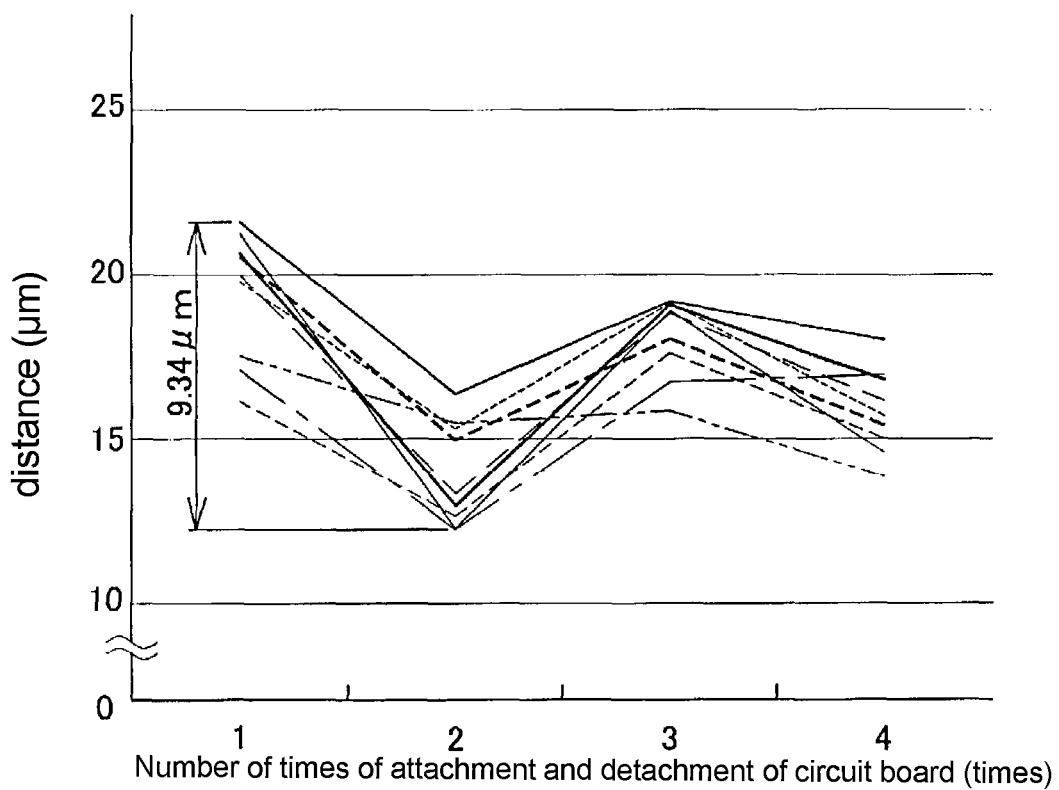

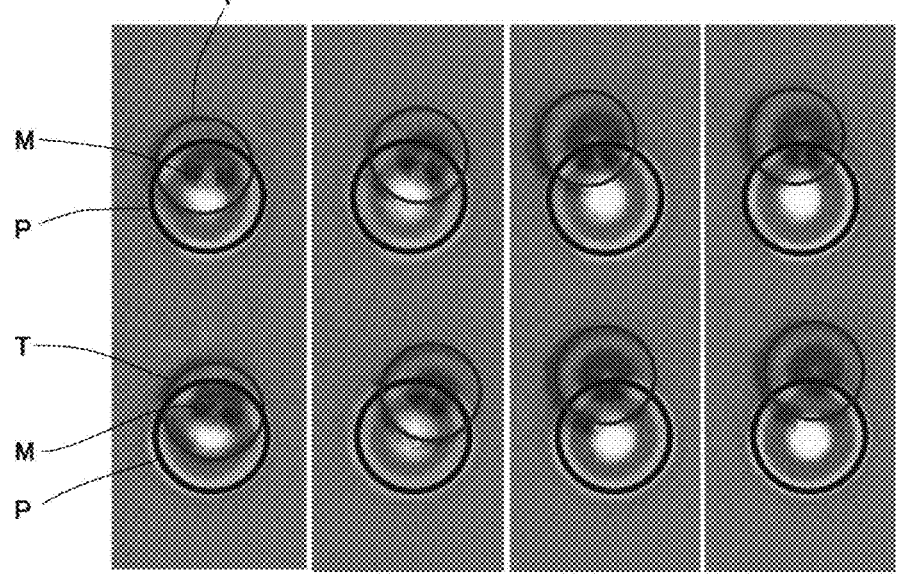

INSPECTION JIG

CROSS-REFERENCE TO RELATED APPLICATION

This application claims priority to Japanese Patent Application Serial No. 2013-230851, which was filed Nov. 7, 2013, and is incorporated herein by reference in its entirety.

TECHNICAL FIELD

Various embodiments generally relate to an inspection jig for electrically connecting inspection points which are disposed on a circuit board or substrate to be inspected (hereinafter referred to as an inspection circuit board) as an inspection object and an inspection apparatus which inspects the inspection circuit board.

BACKGROUND

The inspection jig is used to detect electrical characteristics of an inspection object part of an object to be inspected, and to perform a performance test or similar actions, by supplying electric power (or an electrical signal, etc.) at a predetermined inspection position from the inspection apparatus to the inspection object part via a contactor(s) and by detecting the electrical signal from the inspection object part.

As the object to be inspected, there are listed various circuit boards such as, for example, a printed circuit board, a flexible board, a ceramic multilayer wiring board, an electrode plate for a liquid crystal display and a plasma display, a package substrate for semiconductor package and a film carrier, and a semiconductor apparatus such as a semiconductor wafer, a semiconductor chip and a chip size package (CSP).

In this description, the aforementioned objects to be inspected are generally referred to as an "object to be inspected", and the inspection object part set on the object to be inspected is referred to as an "inspection point".

For example, if the object to be inspected is a circuit board, and if electrical and electronic components, such as a semiconductor circuit like an IC and a resistor, are mounted on the circuit board, then, the inspection object part is a wire or an electrode. In that case, in order to ensure that the object part can accurately transmit the electrical signal to the mounted components, the electrical characteristics such as a resistance value between predetermined inspection points on wires formed on a printed circuit board before the mounting of electrical and electronic components, a liquid crystal panel and a plasma display panel are measured to determine the quality of the wires.

Specifically, the determination of the quality of the wires is performed by making tips of current supply terminals and/or contactors for voltage measurement abut on respective inspection points, supplying measurement current to the inspection points from the current supply terminals of the contactors, measuring voltage generated between the tips of the contactors which abut on the inspection points, and calculating the resistance value of the wires between predetermined inspection points from the supplied current and the measured voltage.

Moreover, when the inspection circuit board is inspected by using a circuit board inspection apparatus, the following control is performed; a tool moving device is moved to make inspection contactors (or contact pins) of a circuit board inspection jig abut on a contact part of the inspection circuit board, thereby performing a predetermined inspection, and if the inspection ends, the inspection jig is moved by the tool moving device to move away from the inspection circuit board.

Here, for example, an inspection jig disclosed in Japanese Patent Application Laid Open No. 2009-047512 is provided with a tip or head side support body, a back-end side support body disposed with a predetermined gap from the head side support body, and a connector or coupler configured to couple or connect the head side support body and the back-end side support body. The inspection jig allows vertical sliding of the head side support body and the back-end side support body.

In the head side support body, there is formed a head side through hole in a direction perpendicular to a facing surface or opposite surface opposed to the inspection object. In the back-end side support body, there is formed a back-end side through hole in a direction inclined with respect to a direction of the formation of the head side through hole. The back-end side through hole is inclined with respect to the head side through hole such that a head side of a probe(s) inserted through the back-end side through hole is directed to the head side through hole. The tip of the probe(s) is guided by the head side through hole and is brought into contact with inspection point. A back end of the probe(s) is guided by the back-end side through hole and is brought into contact with an electrode of an electrode support body.

Moreover, the electrode support body having the electrode with which the back end of the probe is in contact is provided with a biasing mechanism which is disposed with a predetermined gap from the back-end side support body for holding the probe(s) and which is configured to bias the back-end side support body. The biasing mechanism has a conically formed tip. The biasing mechanism of the back-end side support body can also perform positioning in a horizontal direction of the head side support body and the back-end side support body which are integrally formed, by being inserted into an insertion hole provided in a part on which the biasing mechanism of the back-end side support body abuts.

In the inspection jig disclosed in Japanese Patent Application Laid Open No. 2009-047512, when the circuit board as the inspection object is not pressed to the head-side support body, the head-side support body and the back-end side support body are integrally lifted up by the biasing force of the biasing mechanism, and the tip of the probe(s) is accommodated in the head-side through hole of the head-side support body. On the other hand, when the circuit board is pressed to the head-side support body to perform the inspection, the head-side support body and the back-end side support body are pressed down by pressing force of the circuit board against the biasing force of the biasing mechanism, and the tip of the probe(s) projects from the head-side through hole of the head-side support body to be brought into contact with the inspection point. This prevents that the rubbing of the tip of the probe(s) in contact with the surface of the inspection point causes a large dent on the surface of the inspection point.

In the inspection jig described in Japanese Patent Application Laid Open No. 2009-047512, however, the insertion of the tip of the biasing mechanism into the insertion hole of the back-end side support body allows the positioning in the horizontal direction of the head-side support body and the back-end side support body which are integrally formed. Thus, if a horizontal position of the tip is shifted, a horizontal position of the head-side support body is shifted, and as a result, a contact position of the probe(s) guided by the head-side support body on the circuit board is shifted. The biasing mechanism is a movable mechanism which can slide while applying the biasing force to the head-side support body and the back-end side support body, and it is thus hard to accurately maintain the horizontal position of the tip of the biasing mechanism. Therefore, the inspection jig described in Japanese Patent Application Laid Open No. 2009-047512 has a disadvantage which is reduced positioning accuracy of the contact position of the probe tip on the circuit board.

SUMMARY

Various embodiments provide an inspection jig which may improve the positioning accuracy of the contactors which are in contact with the circuit board.

The inspection apparatus of the present disclosure is an inspection jig for electrically connecting inspection points which are disposed on an inspection circuit board as an inspection object and an inspection apparatus which inspects the inspection circuit board, the inspection jig provided with: a frame; an electrode body provided with electrodes electrically connected to the inspection apparatus; conductive contactors having a wire shape; a support block having a facing surface opposite to which the inspection circuit board is disposed, guiding one ends of the contactors to the inspection points of the inspection circuit board mounted on the facing surface, guiding other ends of the contactors to the electrodes, and configured to move relatively to the frame in a moving direction which crosses the facing surface; biasing parts configured to bias the support block in a direction moving away from the electrode body and close to the inspection circuit board; and a first regulating member disposed between the support block and the frame so as to extend in an extending direction directed from the support block to the frame, having elasticity, and having regulation of deformation in a first direction which is parallel to the facing surface and which crosses the extending direction.

According to this configuration, the first regulating member, in which the deformation is regulated in the first direction which is parallel to the facing surface and which crosses the extending direction, is disposed between the support block and the frame, and thus, a position shift of the support block in the first direction is prevented. This results in a reduction in the position shift of the contactors guided by the support block, thereby improving the positioning accuracy of the contactors which are in contact with the circuit board. Moreover, the elasticity of the first regulating member reduces a possibility that the movement of the support block in the moving direction is prevented by the first regulating member.

Moreover, the first regulating member is preferably a plate-like member which has flexibility and in which a first slit extending in the first direction is formed.

According to this configuration, the elasticity is applied by the first slit to the plate-like first regulating member in the direction perpendicular to the first direction. Moreover, the plate-like first regulating member has high stiffness in the first direction in which the first slit extends, and thus, the deformation in the first direction is regulated.

A plurality of first slits are preferably formed in the first regulating member.

According to this configuration, the elasticity of the first regulating member improves.

Moreover, there is preferably further provided a second regulating member disposed between the support block and the frame so as to extend in the first direction, having elasticity, and having regulation of deformation in a second direction which is parallel to the facing surface and which crosses the first direction.

According to this configuration, as in the case of the first regulating member, a position shift of the support block in the second direction is regulated by the second regulating member. This results in a reduction in the position shift of the contactors in the second direction in addition to the first direction, thereby improving the positioning accuracy of the contactors which are in contact with the circuit board. Moreover, the elasticity of the second regulating member reduces a possibility that the movement of the support block in the moving direction is prevented by the second regulating member.

Moreover, the second regulating member is preferably a plate-like member which has flexibility and in which a second slit extending in the second direction is formed.

According to this configuration, the elasticity is applied by the second slit to the plate-like second regulating member in the direction perpendicular to the second direction. Moreover, the plate-like second regulating member has high stiffness in the second direction in which the second slit extends, and thus, the deformation in the second direction is regulated.

A plurality of second slits are preferably formed in the second regulating member.

According to this configuration, the elasticity of the second regulating member improves.

Moreover, preferably, the inspection jig is provided with a second regulating member disposed between the support block and the frame so as to extend in the first direction, having elasticity, and having regulation of deformation in a second direction which is parallel to the facing surface and which crosses the first direction, the support block is disposed to be surrounded by the frame on a flat surface parallel to the facing surface and to have an interval between a peripheral part of the support block and the frame, the first and second regulating members are made of a plate-like regulating plate which is disposed substantially parallel to the facing surface, which has openings through which the contactors can pass, and which has flexibility, a central side of the regulating plate is fixed to the support block, and a peripheral side of the regulating plate is fixed to the frame, a first slit extending in the first direction and a second slit extending in a direction which crosses the first direction are formed in the regulating plate in a space between the peripheral part and the frame, and a vicinity of the first slit of the regulating plate is the first regulating member and a vicinity of the second slit of the regulating plate is the second regulating member.

According to this configuration, the first and second regulating members can be made of one regulating plate, and it is thus easy to manufacture the inspection jig.

Moreover, preferably, the support block has a cross section in a substantially rectangular shape which is parallel to the facing surface, and has first and second sides extending in the first direction, and third and fourth sides extending in the second direction, the regulating plate has two first slits arranged in parallel in a space between the frame and the first side, two first slits arranged in parallel in a space between the frame and the second side, two second slits arranged in parallel in a space between the frame and the third side, and two second slits arranged in parallel in a space between the frame and the fourth side, one of the two first slits between the frame and the first side and one of the two second slits between the frame and the third side are communicated to form a substantially L-shaped slit, the other second slit between the frame and the third side and one of the two first slits between the frame and the second side are communicated to form a substantially L-shaped slit, the other first slit between the frame and the second side and one of the two second slits between the frame and the fourth side are communicated to form a substantially L-shaped slit, and the other second slit between the frame and the fourth side and the other first slit between the frame and the first side are communicated to form a substantially L-shaped slit.

According to this configuration, it is preferable in that the substantially L-shaped slits further facilitate expansion and contraction of the regulating plate.

Moreover, preferably, the support block is configured to adopt: a standby posture in which the support block is separated from the electrode body by biasing force of the biasing parts; and an inspection posture obtained by being displaced in the moving direction from the standby posture against the biasing force of the biasing parts, and the regulating plate is flat when the support block has the inspection posture.

According to this configuration, the regulating plate has less distortion in a non-deformation state than in a deformation state, and thus has high positioning accuracy of the support block. Therefore, in the inspection posture, the positioning accuracy upon inspection can be further improved by flattening the regulating plate.

Moreover, the support block is preferably provided with: an inspection-side support body having a facing surface opposite to which the inspection circuit board is disposed, and having inspection guide holes through which the contactors are inserted and which guide one ends of the contactors to the inspection points of the inspection circuit board mounted on the facing surface; an electrode-side support body having electrode guide holes through which the contactors are inserted and which guide the other ends of the contactors to the electrodes; and connecting members configured to arrange and hold the inspection-side support body and the electrode-side support body with a predetermined interval therebetween.

According to this configuration, it is possible to use the support block which is provided with the inspection-side support body, the electrode-side support body, and the connecting members.

The inspection jig as configured above may improve the positioning accuracy of the contactors which are in contact with the circuit board.

BRIEF DESCRIPTION OF THE DRAWINGS

FIG. 9 is an explanatory diagram illustrating a result of an experiment for confirming the effect of the regulating plate illustrated in FIG. 1;

FIG. 10A to FIG. 10D are explanatory diagrams illustrating a result of an experiment without the regulating plate illustrated in FIG. 1.

DETAILED DESCRIPTION

Figure 1:
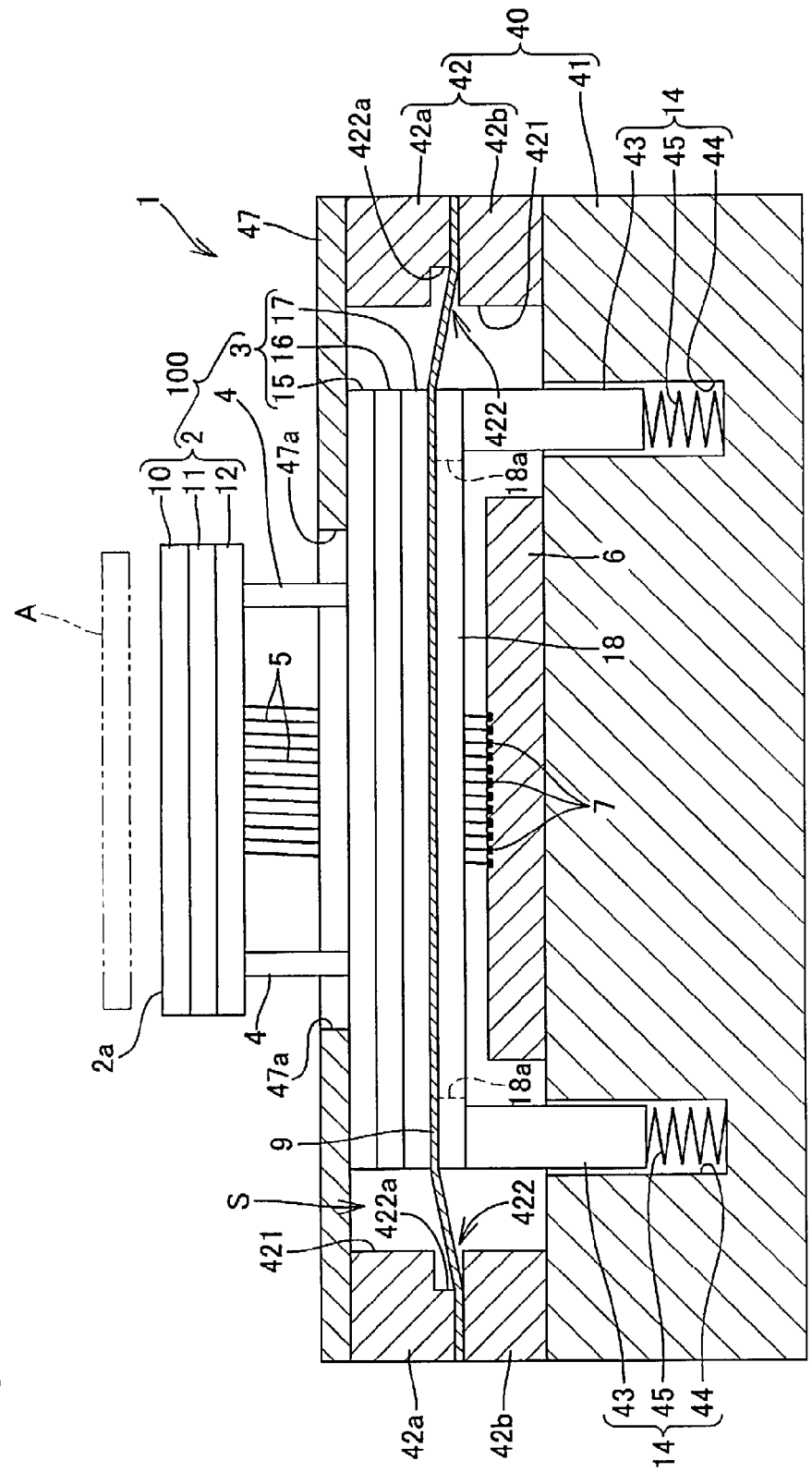
FIG. 1 is a schematic cross sectional view illustrating an inspection jig in an embodiment of the present disclosure.
Figure 2:
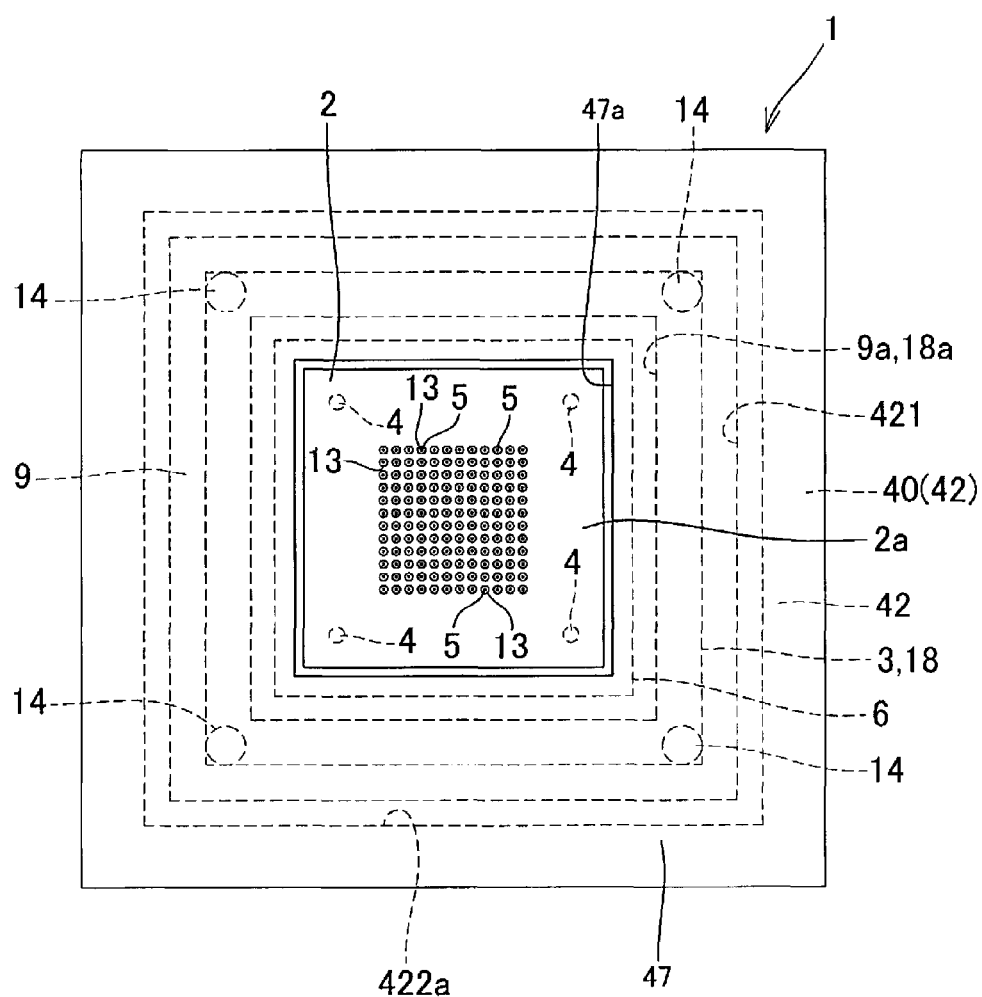
FIG. 2 is a plan view illustrating the inspection jig illustrated in FIG. 1.
Figure 3:
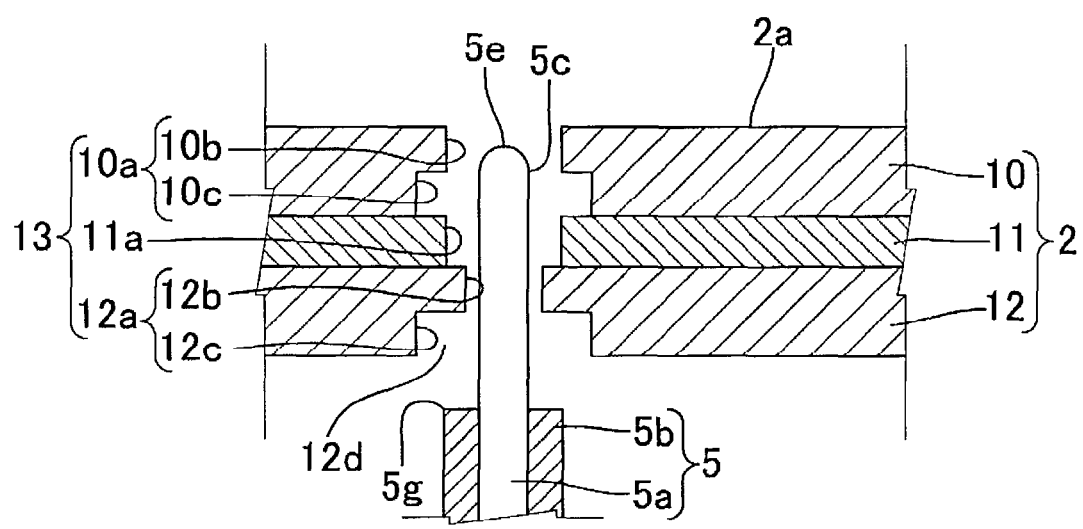
FIG. 3 is a schematic partial cross sectional view illustrating a cross section structure of an inspection-side support body illustrated in FIG. 1.
Figure 4A:
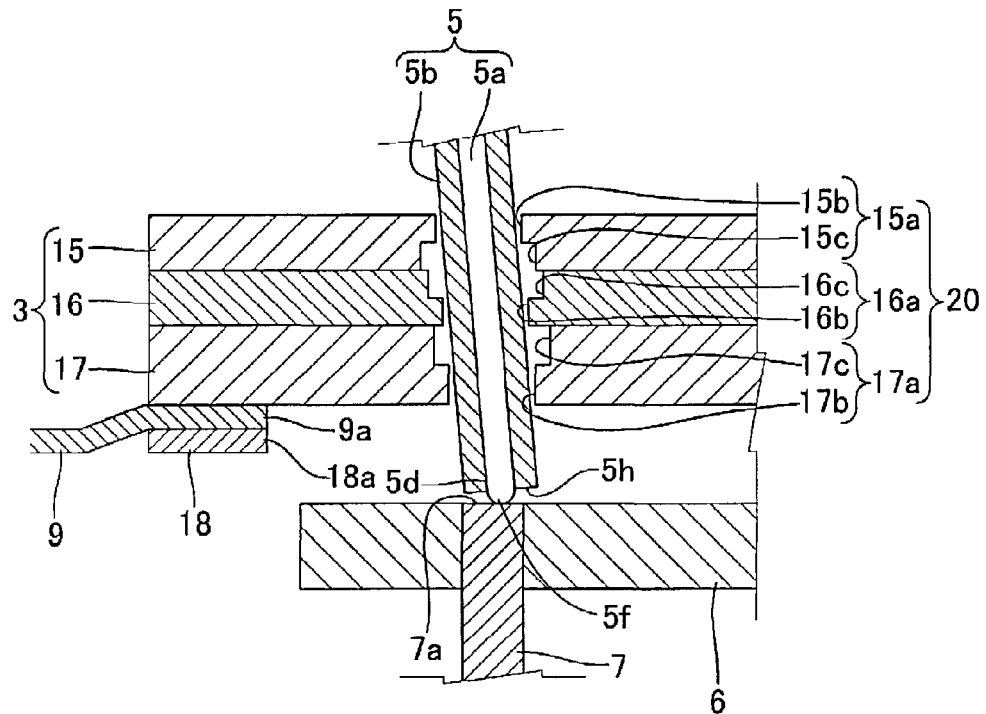
FIG. 4A and FIG. 4B are schematic partial cross sectional views illustrating a cross section structure of an electrode-side support body illustrated in FIG. 1 in the case of non-inspection and in the case of inspection, respectively.
Figure 4B:
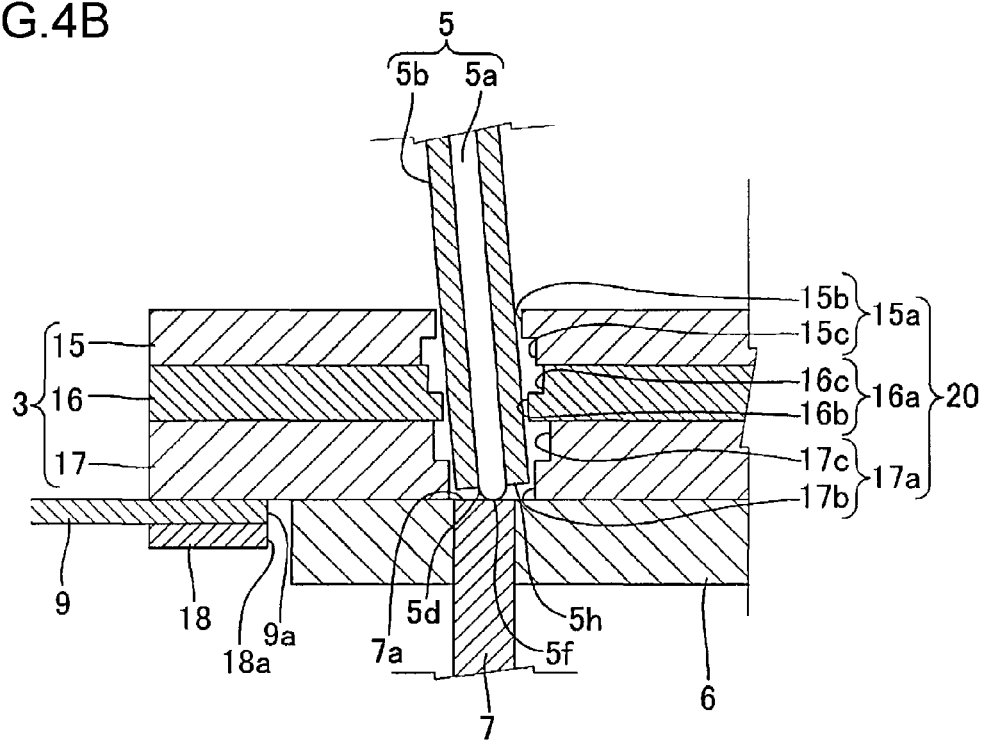

The following detailed description refers to the accompanying drawings that show, by way of illustration, specific details and embodiments in which the invention may be practiced. FIG. 1 is a schematic cross sectional view illustrating an inspection jig 1 in an embodiment of the present disclosure. FIG. 2 is a plan view illustrating the inspection jig 1 illustrated in FIG. 1. FIG. 3 is a schematic partial cross sectional view illustrating a cross section structure of an inspection-side support body 2 illustrated in FIG. 1. FIG. 4A and FIG. 4B are schematic partial cross sectional views illustrating a cross section structure of an electrode-side support body 3 illustrated in FIG. 1 in the case of non-inspection and in the case of inspection, respectively.

In the explanation below, an upward vertical direction in the drawing is explained as "tip, head, front, front side, or forward", and a downward vertical direction in the drawing is explained as "back, back side, or backward".

The inspection jig 1 illustrated in FIG. 1 is used by being mounted on an inspection apparatus configured to perform electrical inspection of a circuit board or substrate A to be inspected (hereinafter referred to as an inspection circuit board A), such as a printed circuit board and a semiconductor integrated circuit. Each electrode 7 described later and the inspection apparatus are connected by a not-illustrated cable. One end of each contactor 5 described later is in contact with an inspection point, and the other end is in contact with respective one of electrodes 7. This makes it possible to electrically connect inspection points disposed on the inspection circuit board A as an inspection object and the inspection apparatus which inspects the inspection circuit board A.

The inspection jig 1 illustrated in FIG. 1 and FIG. 2 is provided with a frame 40, an electrode body 6 provided with the electrodes 7, the conductive contactors 5 having a wire shape, a support block 100, biasing parts 14, and a regulating plate 9.

The frame 40 is provided with a base 41 and a wall 42 upwardly standing from a peripheral part of the base 41. On a front end of the wall 42, a regulating plate 47 is mounted. This provides an inner space S surrounded by the base 41, the wall 42, and the regulating plate 47. In a substantially central part of the regulating plate 47, an opening 47a is formed.

On a wall surface 421 of the wall 42 facing the inner space S, there is groove 422 extending in parallel with a facing surface or opposite surface 2a and formed to surround the inner space S. The width of the groove 422 is set to be, for example, about 0.5 mm.

The wall 42 is formed by combining a front wall block 42a on a front side and a back wall block 42b on a back side. Then, a peripheral part of the regulating plate 9 in a plate shape is sandwiched between the front wall block 42a and the back wall block 42b, and the regulating plate 9 is held in the inner space S substantially in parallel with the facing surface 2a.

On a back end of the front wall block 42a, there is formed a notch on the wall surface 421. The groove 422 is formed of the notch of the front wall block 42a and an front wall surface of the back wall block 42b by combining the front wall block 42a and the back wall block 42b on the back side. By this, the groove 422 provides a space in which the regulating plate 9 can be deformed forward.

The support block 100 is provided with the inspection-side support body 2, the electrode-side support body 3 disposed on the back side of the inspection-side support body 2 with a predetermined interval, connecting members 4 configured to arrange and integrally hold the inspection-side support body 2 and the electrode-side support body 3 with a predetermined interval therebetween.

The inspection-side support body 2 has guide holes 13 each of which guides one end (or tip 5e) of respective one of contactors 5 described later (refer to FIG. 3) to each of the inspection points. The electrode-side support body 3 has electrode guide holes 20 each of which guides the other end (or back end 5f) of respective one of the contactors 5 to each of the electrodes 7 (refer to FIG. 4A and FIG. 4B).

Each of the inspection-side support body 2 and the electrode-side support body 3 is formed in a flat rectangular parallelepiped shape (or rectangular plate shape). Moreover, the inspection-side support body 2 and the electrode-side support body 3 are arranged such that the surfaces thereof are in parallel with each other.

Specifically, the inspection-side support body 2 and the electrode-side support body 3 are connected and fixed by four rod-like connecting members 4 disposed at four corners of the inspection-side support body 2 (refer to FIG. 1 and FIG. 2). The electrode-side support body 3 is accommodated in the inner space S of the frame 40, and is disposed to be surrounded by the frame 40 on a cross section parallel to the facing surface 2a and to have an interval between a peripheral part of the electrode-side support body 3 and the frame 40.

The inspection-side support body 2 is disposed outside the inner space S, and the connecting members 4 pass through the opening 47a of the regulating plate 47 and connect the inspection-side support body 2 and the electrode-side support body 3. The opening 47a is smaller than the electrode-side support body 3 so that the electrode-side support body 3 cannot pass through the opening 47a.

Moreover, the plurality of contactors 5 which are in contact with the inspection points of the inspection circuit board A are inserted in the inspection-side support body 2 and the electrode-side support body 3.

The electrode body 6 is mounted on the base 41 in the inner space S of the frame 40, and is disposed on the back side of the electrode-side support body 3 (refer to FIG. 1). In the electrode body 6, as illustrated in FIG. 1, there are fixed the plurality of electrodes 7 each of which is in conductive contact with respective one of the contactors 5 (specifically, the back end 5f of the contactor 5).

Each of the contactors 5 is made of metal such as tungsten, high-speed steel (SKH), and beryllium copper (Be—Cu), or other conductors, and is formed in a bar shape having flexible elasticity (or flexibility).

Each of the contactors 5 in the embodiment, as illustrated in FIG. 3, FIGS. 4A and 4B, is provided with a conductive part 5a made of the conductors as described above, and an insulating part 5b which covers an outer circumferential surface of the conductive part 5a. The insulating part 5b is made of an insulator such as synthetic resins. The insulating part 5b can use an insulating film formed by performing insulating coating on a surface of the conductive part 5a. The insulating part 5b is not formed on both ends of the contactor 5. A first end 5c is formed on one end (or tip) of the contactor 5, and a second end 5d is formed on the other end (or back end) of the contactor 5. For convenience of explanation, a part of the first end 5c which abuts on the inspection point is assumed to be the tip 5e, and a part of the second end 5d which abuts on the electrode is assumed to be the back end 5f.

The tip 5e of the first end 5c and the back end 5f of the second end 5d can be formed in a hemispherical shape as illustrated.

The first end 5c of the contactor 5 is inserted and supported in the inspection guide hole 13 of the inspection-side support body 2 upon inspection (refer to FIG. 3). The tip 5e of the first end 5c is brought into conductive contact with the inspection point formed on the inspection circuit board A. The inspection circuit board A is disposed opposite to the farcing surface 2a in a state in which a horizontal relative position to the frame 40 is positioned by a not-illustrated positioning mechanism.

The length of the first end 5c is formed to be longer than that of the inspection guide hole 13. This is because the contactor 5 is sandwiched and bent between the inspection point and the electrode upon inspection. FIG. 3 illustrates the inspection jig during non-inspection in which the first end 5c of the contactor 5 is accommodated in the inspection guide hole 13, and the tip 5e of the first end 5c is disposed in the inspection guide hole 13.

The first end 5d of the contactor 5 is guided to the electrode 7 (or a contact surface 7a) by the electrode guide hole 20 of the electrode-side support body 3 described later (refer to FIG. 4A and FIG. 4B). The back end 5f of the second end 5e is in conductive contact with the electrode 7.

The inspection-side support body 2 is formed by laminating a plurality of (in the embodiment, three) support plates 10, 11, and 12 in order from the side of the inspection circuit board A disposed (or front side). The support plates 10 to 12 are fixed to each other by a fixing device such as a bolt.

Moreover, as illustrated in FIG. 3, through holes 10a, 11a, and 12a are formed in the support plates 10, 11, and 12, respectively. The arrangement of the through holes 10a, 11a, and 12a to be connected to each other provides one inspection guide hole 13 through which the first end 5c of the contactor 5 is inserted.

Moreover, a surface on the front side of the support plate 10 is the facing surface 2a on which the inspection circuit board A is mounted, namely, opposite to which the inspection circuit board A is disposed.

The inspection guide hole 13 has a guiding direction of the contactor 5 directed forward, to the inspection circuit board A. Specifically, the inspection guide hole 13 has a guiding direction of the contactor 5 perpendicular to the facing surface 2a. It is thus possible to bring the tip 5e of the contactor 5 into contact with the inspection point of the inspection circuit board A at substantially right angles.

Moreover, there are formed the same number of inspection guide holes 13 as the number of the contactors 5 of the inspection jig 1.

The three through holes 10a, 11a, and 12a are concentrically formed. In FIG. 3, the through hole 10a is provided with a small-diameter hole 10b and a large-diameter hole 10c which is larger than the small-diameter hole 10b. The through hole 12a is provided with a small-diameter hole 12b and a large-diameter hole 12c which is larger than the small-diameter hole 12b.

The small-diameter hole 10b and the small-diameter hole 12b are formed to have inner diameters which are slightly larger than an outer diameter of the conductive part 5a and which are slightly smaller than an outer diameter of the contactor 5 in a part in which the insulating part 5b is formed.

Moreover, an inner diameter of the through hole 11a is larger than the inner diameter of the small-diameter hole 10b and the inner diameter of the small-diameter hole 12b.

An tip edge 5g, which is a boundary between the conductive part 5a formed on the first end 5c of the contactor 5 and the insulating part 5b, is disposed on the back side of the small-diameter hole 12b of the inspection guide hole 13, as illustrated in FIG. 3.

Moreover, as described above, the small-diameter hole 12b is formed to have the inner diameter which is slightly smaller than the outer diameter of the contactor 5 in the part in which the insulating part 5b is formed. Thus, the tip edge 5g of the insulating part 5b abuts on an opening edge 12d of the small-diameter hole 12b. In other words, the tip edge 5g and the opening edge 12d are a stopper for preventing the contactor 5 from coming out to the inspection object side.

The electrode-side support body 3 is formed by laminating a plurality of (in the embodiment, three) support plates 15, 16, and 17 in order from the side of the inspection-side support body 2. Moreover, on a surface on the back side of the support plate 17, there are mounted the regulating plate 9 and a spacer 18 to surround a peripheral portion of the support plate 17. The support plates 15 to 17, the regulating plate 9, and the spacer 18 are laminated in this order and is fixed to each other by a fixing device such as a bolt.

By this, the regulating plate 9 is fixed to the electrode-side support body 3 such that the regulating plate 9 is sandwiched between the electrode-side support body 3 and the spacer 18. An opening 9a is formed in substantially the center of the regulating plate 9, and an opening 18a is formed in substantially the center of the spacer 18 to correspond so as to the opening 9a.

As illustrated in FIG. 4A or FIG. 4B, through holes 15a, 16a, and 17a are formed in the support plates 15, 16, and 17, respectively. The arrangement of the through holes 15a to 17a to be connected to each other provides one electrode guide hole 20 through which the second end 5d of the contactor 5 is inserted. There are formed the same number of electrode guide holes 20 as the number of the contactors 5 of the inspection jig 1.

The electrode guide hole 20 is formed in a guiding direction inclined with respect to the guiding direction formed in the inspection guide hole 13 (i.e. the direction perpendicular to the facing surface 2a). In other words, the three through holes 15a to 17a are formed such that the centers thereof are slightly shifted from each other, and are formed in a direction in which the entire electrode guide hole 20 inclines with respect to the direction perpendicular to the facing surface 2a.

For example, as illustrated in FIG. 4A, the three through holes 15a to 17a are formed such that the centers thereof are slightly shifted to the right illustrated in order of the through holes 15a to 17a. In other words, the guiding direction of guiding the back-end side of the contactor 5 is a direction inclined with respect to a normal line perpendicular to a surface of the electrode-side support body 3.

The through hole 15a is provided with a small-diameter hole 15b and a large-diameter hole 15c which is larger than the small-diameter hole 15b. In the same manner, the through hole 16a is provided with a small-diameter hole 16b and a large-diameter hole 16c, and the through hole 17a is provided with a small-diameter hole 17b and a large-diameter hole 17c.

The small-diameter holes 15b, 16b, and 17b are formed to have inner diameters which are slightly larger than the outer diameter of the contactor 5 in the part in which the insulating part 5b is formed.

A back end edge 5h of the insulating part 5b can be inserted into the small-diameter hole 17b. The contactor 5 is disposed to incline with respect to the normal line perpendicular to the surface of the electrode-side support body 3. Thus, the contactor 5 is disposed to incline with respect to the small-diameter hole 17b, as illustrated in FIG. 4B. The small-diameter hole 17b is formed such that an axial direction thereof is perpendicular to the surface of the electrode-side support body 3.

The back end edge 5h, which is a boundary between the conductive part 5a formed on the second end 5d of the contactor 5 and the insulating part 5b, is disposed on the back side of the large-diameter hole 17c of the electrode guide hole 20, as illustrated in a state of the inspection jig upon inspection in FIG. 4B.

At this time, a movable amount of the back end 5f moving in a direction parallel to a back surface of the electrode-side support body 3 is regulated in a range in which the contactor 5 moves inside the small-diameter hole 17b. Thus, if the contactor 5 is inclined and inserted (in transition from non-inspection to inspection, or in transition from inspection to non-inspection), the movable amount of the back end 5f of the second end 5d can be set extremely small, and thus, the contactor is stably in contact with the electrode.

This makes it possible to perform accurate positioning of the contact surface 7a and the back end 5f if the contact surface 7a of the electrode 7 described later and the back end 5f are brought into contact. Particularly in actual inspection, normally, there are provided several thousands of contactors 5 and electrodes 7, and the easy positioning of the contact surface 7a and the back end 5f significantly contributes to a reduction in operation time.

The electrode body 6 is formed in a substantially rectangular parallelepiped shape, and a back end surface of the electrode body 6 is fixed to a front surface of the base 41, as illustrated in FIG. 1. On a front surface side of the electrode body 6, there are embedded the plurality of electrodes 7. As described above, each of the electrodes 7 is configured to be connected to the inspection apparatus by the not-illustrated cable.

A surface on the front side of the electrode 7 is the contact surface 7a with which the back end 5f of the contractor 5 is in contact, as illustrated in FIG. 4A and FIG. 4B. The back end 5f of the contractor 5 is formed in the hemispherical shape as described above. Thus, even if the second end 5d of the contactor 5 is inclined along the electrode guide hole 20 having the inclined guiding direction, the back end 5f and the contact surface 7a are in a preferable conductive contact state.

Moreover, the biasing parts 14 configured to bias the electrode-side support body 3 toward the front side are mounted on the base 41 in the inner space S. Specifically, as illustrated in FIG. 2, the biasing parts 14 are mounted at positions corresponding to vicinities of four corners of the electrode-side support body 3 and the spacer 18.

Each of the biasing parts 14 is provided with an abutting member 43 which projects from the front surface of the electrode body 6 and abuts on the electrode-side support body 3, and a guide hole 44 in which a back-end side of the abutting member 43 is accommodated, and a compression spring 45 which biases the abutting member 43 forward with respect to the guide hole 44 (refer to FIG. 1).

The guide hole 44 is formed on the base 41 in a bottomed cylindrical shape in which the front end side opens. The abutting member 43 is formed in a columnar shape having a flat end surface perpendicular to a longitudinal direction. Thus, a tip side or head side of the abutting member 43 abuts on a back surface of the spacer 18.

On the back-end side of the abutting member 43 in the guide hole 44, there is disposed the compression spring 45. Specifically, the compression spring 45 is disposed in the guide hole 44 such that ends of the compression spring 45 abut on the back end surface of the abutting member 43 and a bottom surface of the guide hole 44, respectively. The biasing part 14 is not limited to the compression spring 45 but may be anything that can generate biasing force by using an elastic member such as a flat spring and rubber.

In the embodiment as described above, the biasing parts 14 are mounted on the base 41 and bias the electrode-side support body 3 forward. In other words, the biasing parts 14 bias the electrode-side support body 3 in a direction moving away from the electrode body 6 and close to the inspection circuit board A.

By this, during non-inspection, in a state in which the compression spring 45 is slightly compressed, the abutting member 43 abuts on the back surface of the spacer 18, and the front surface of the electrode-side support body 3 abuts on the regulating plate 47. In other words, the support block 100 has a standby posture in which the electrode-side support body 3 is separated from the electrode body 6 and abuts on the regulating plate 47 in the state of being biased by the biasing parts 14 (refer to FIG. 1).

Moreover, in the standby posture, there is formed a slight gap between the electrode-side support body 3 and the electrode body 6.

In the standby posture, the inspection-side support body 2, the electrode-side support body 3 and the connecting members 4 are biased forward, and the tips 5*e* of the contactors 5 do not project from the facing surface 2*a* (refer to FIG. 1). In other words, in this state, the tips 5*e* of the contactors 5 are accommodated in the respective inspection guide holes 13.

Figure 7:
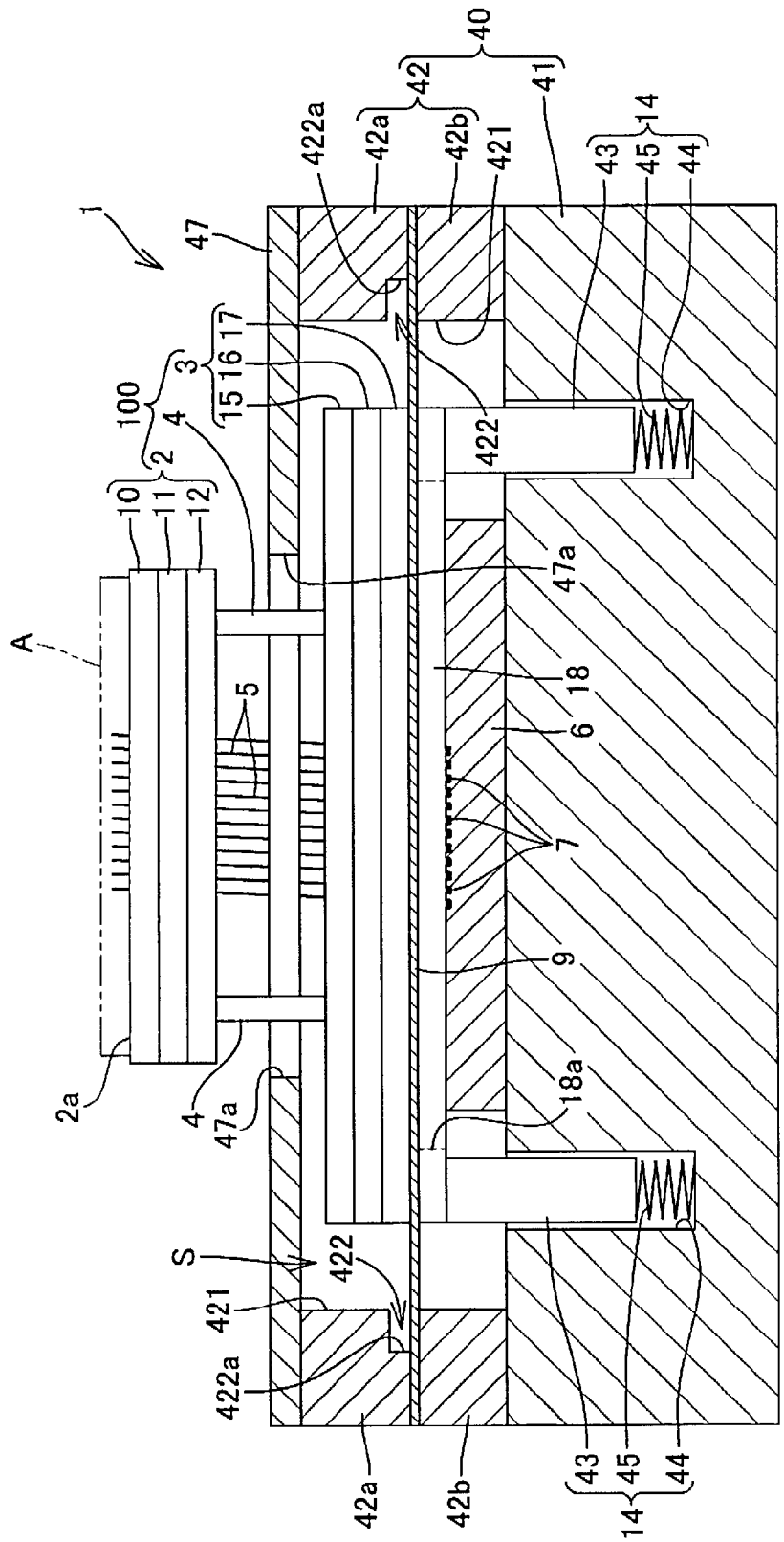
FIG. 7 is a schematic cross sectional view illustrating a state in which a support block illustrated in FIG. 1 adopts an inspection posture.

The support block 100 is also configured to adopt an inspection posture obtained by being displaced backward from the standby posture against the biasing force of the biasing parts 14 (refer to FIG. 7). The inspection posture will be described later.

Figure 5:
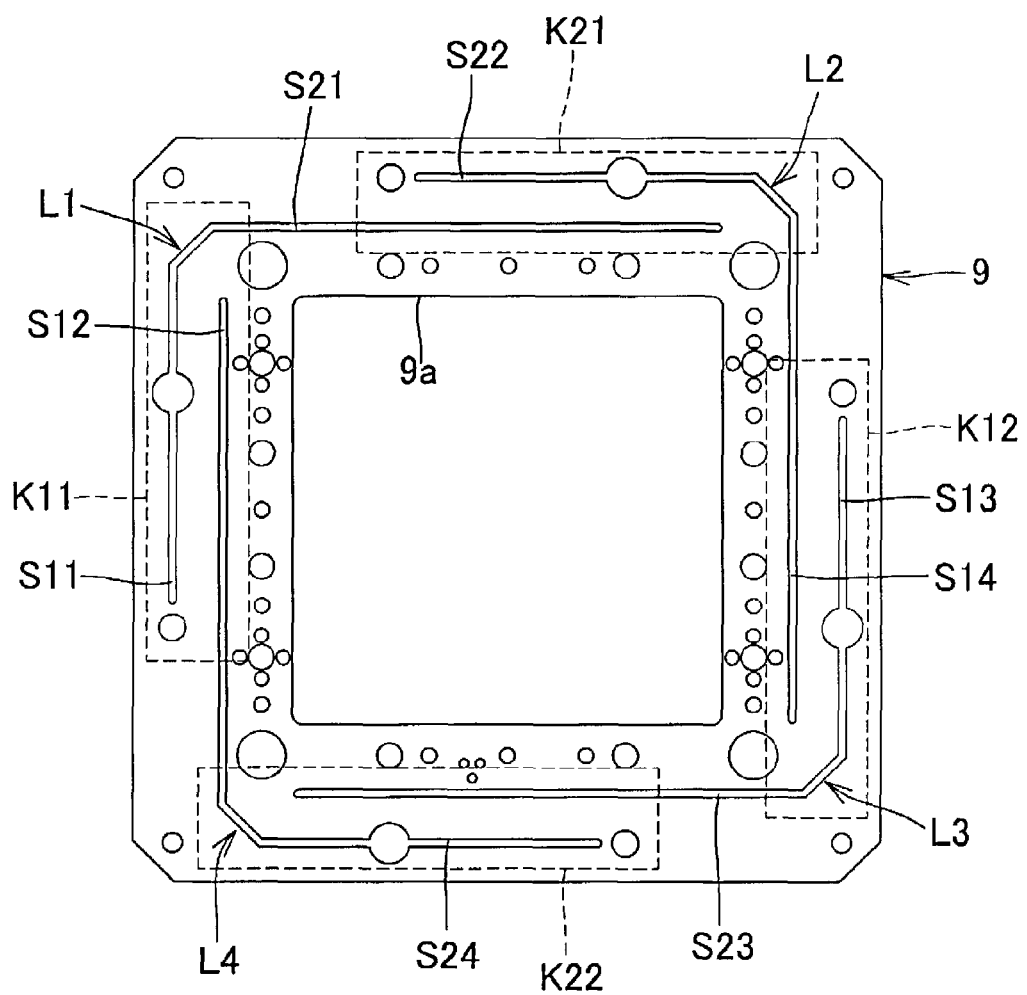
FIG. 5 is a plan view illustrating one example of a regulating plate illustrated in FIG. 1.

FIG. 5 is a plan view illustrating one example of the regulating plate 9 illustrated in FIG. 1. The regulating plate 9 is made of a plate-like member having flexibility. For example, the regulating plate 9 is made of stainless (SUS304CSP) with a thickness of about 0.2 mm, or the like. The regulating plate 9 has a shape substantially corresponding to the wall 42, and is substantially square in the example illustrated in FIG. 5. In a substantially central part of the regulating plate 9, there is formed the opening 9*a* in a shape corresponding to the opening 18*a* of the spacer 18.

Moreover, the regulating plate 9 has substantially L-shaped slits L1, L2, L3 and L4. The L-shaped slits L1, L2, L3 and L4 have, for example, a slit width of about 1 mm.

Moreover, the regulating plate 9 is provided with holes for positioning and mounting, with respect to the electrode-side support body 3 and the space 18. The regulating plate 9 is not limited to being mounted on the electrode-side support body 3 by the spacer 18.

Figure 6:
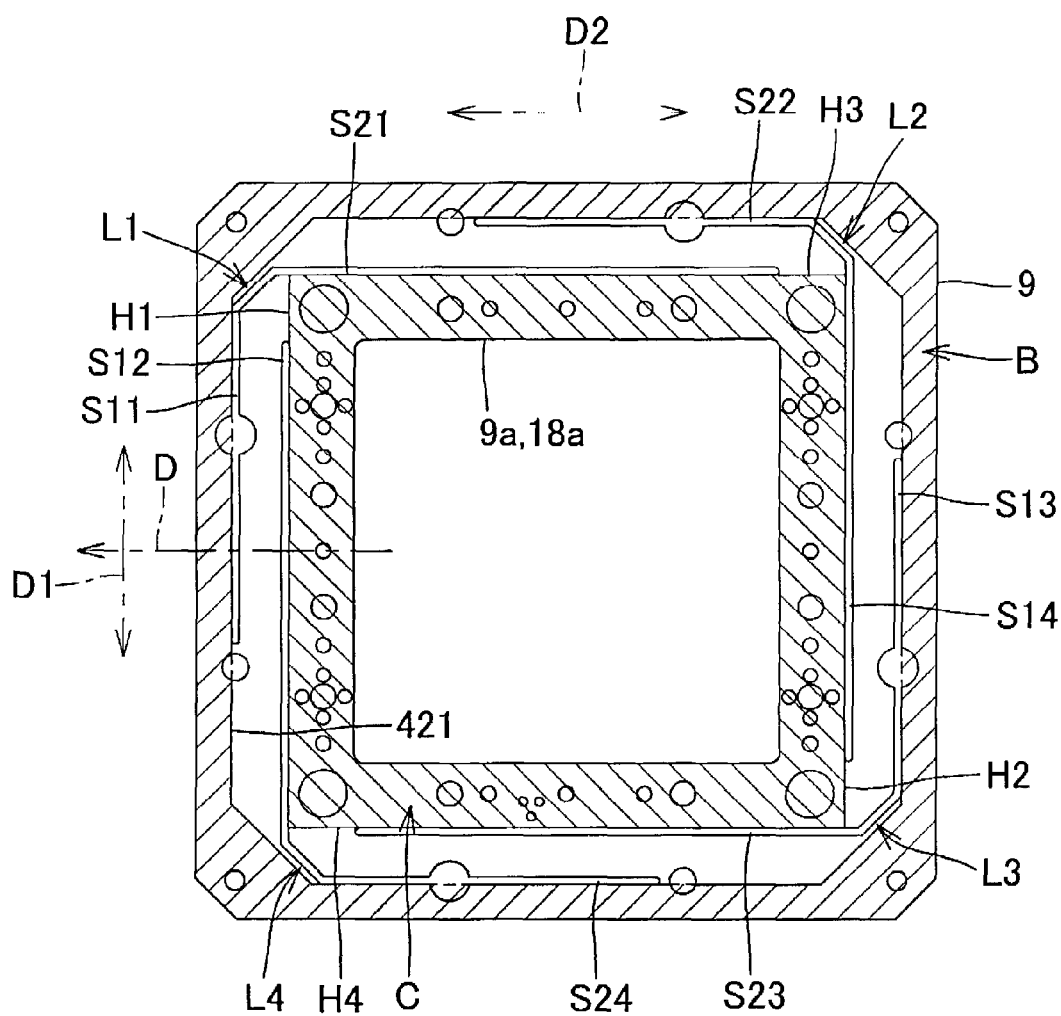
FIG. 6 is an explanatory diagram for explaining a state in which the regulating plate illustrated in FIG. 5 is fixed to a wall (or frame) and the electrode-side support body (or spacer)

FIG. 6 is an explanatory diagram for explaining a state in which the regulating plate 9 illustrated in FIG. 5 is fixed to the wall 42 (or frame 40) and the electrode-side support body 3 (or spacer 18). A region B is a region in which the regulating plate 9 is sandwiched between the front wall block 42*a* and the back wall block 42*b*, i.e. a region in which the regulating plate 9 is fixed to the frame 40. An outer circumference of the region B corresponds to an outer circumference of the wall 42, and an inner circumference of the region B corresponds to the wall surface 421 of the frame 40. The inner circumference of the region B may correspond to a bottom surface 422*a*.

A region C is a region in which the regulating plate 9 is sandwiched between the electrode-side support body 3 and the spacer 18, i.e. a region in which the regulating plate 9 is fixed to the electrode-side support body 3. An outer circumference of the region C corresponds to an outer circumference of the electrode-side support body 3, and an inner circumference of the region C corresponds to the opening 9*a* and the opening 18*a*.

As described above, the central side of the regulating plate 9 is fixed to the electrode-side support body 3, and the peripheral side of the regulating plate 9 is fixed to the frame 40.

As illustrated in FIG. 6, the cross section of the electrode-side support body 3 parallel to the facing surface 2*a* has a substantially rectangular shape, and the electrode-side support body 3 has a first side H1, a second side H2, a third side H3, and a fourth side H4. The first side H1 and the second side H2 are sides extending in a first direction D1 which crosses (substantially at right angles) an extending direction D directed from the electrode-side support body 3 (or support block 100) to the wall surface 421 (or frame 40) and which is parallel to the facing surface 2*a*. The third side H3 and the fourth side H4 are sides extending in a second direction D2 which is parallel to the facing surface 2*a* and which crosses (substantially at right angles) the first direction D1.

The regulating plate 9 has two first slits S11 and S12 arranged in parallel and extending in the first direction D1 in a space between the wall surface 421 (or frame 40) and the first side H1, two first slits S13 and S14 arranged in parallel and extending in the first direction D1 in a space between the wall surface 421 (or frame 40) and the second side H2, two second slits S21 and S22 arranged in parallel and extending in the second direction D2 in a space between the wall surface 421 (or frame 40) and the third side H3, and two second slits S23 and S24 arranged in parallel and extending in the second direction D2 in a space between the wall surface 421 (or frame 40) and the fourth side H4.

Then, the first slit S11 and the second slit S21 are communicated to form the L-shaped slit L1. The second slit S22 and the first slit S14 are communicated to form the L-shaped slit L2. The first slit S13 and the second slit S23 are communicated to form the L-shaped slit L3. The second slit S24 and the first slit S12 are communicated to form the L-shaped slit L4.

With regard to the L-shaped slits L1, L2, L3 and L4, a part or all of the combinations of communication of the first and second slits on the frame 40 side and the first and second slits on the electrode-side support body 3 side out of the two slits arranged in parallel may be replaced.

As described above, in the regulating plate 9, there are formed the first slits S11, S12, S13 and S14 extending in the first direction D1 and the second slits S21, S22, S23 and S24 extending in the second direction D2 in the inner space S.

Then, as illustrated in FIG. 5, vicinities of the slits S11 and S12 of the regulating plate 9 constitute a first regulating member K11. Vicinities of the slits S13 and S14 of the regulating plate 9 constitute a first regulating member K12. Vicinities of the slits S21 and S22 constitute a second regulating member K21. Vicinities of the slits S23 and S24 constitute a second regulating member K22.

When the support block 100 has the standby posture (FIG. 1), the support block 100 moves forward due to the biasing force of the biasing parts 14, and the region C of the regulating plate 9 thus moves forward with the support block 100. At this time, the first regulating members K11 and K12 and the second regulating members K21 and K22 can be extended and deformed in directions crossing the respective slits, by the first slits S11, S12, S13 and S14 and the second slits S21, S22, S23 and S24.

As a result, the support block 100 fixed to the region C can move forward while the region B of the regulating plate 9 is fixed to the frame 40, and can adopt the standby posture.

On the other hand, the plate-like member has high stiffness in a direction parallel to a flat surface thereof. Thus, the first regulating members K11 and K12 made of the plate-like member has regulation of the deformation in the first direction D1 along the first slits S11, S12, S13 and S14. Moreover, the second regulating members K21 and K22 made of the plate-like member has regulation of the deformation in the second direction D2 along the second slits S21, S22, S23 and S24.

Thus, in the inspection jig 1, a position shift of the support block 100 in a horizontal direction, i.e. a position shift of the inspection-side support body 2 in a horizontal direction, is regulated by the regulating plate 9 (or the first regulating members K11 and K12, and the second regulating members K21 and K22) when the support block 100 adopts the standby posture. This results in a reduction in position shift of a relative position of the inspection-side support body 2 to the inspection circuit board A. It is therefore possible to improve the positioning accuracy of the contactors 5 which are in contact with the inspection circuit board A.

FIG. 7 is a schematic cross sectional view illustrating a state in which the support block 100 illustrated in FIG. 1 adopts the inspection posture. If the inspection circuit board A is disposed opposite to the facing surface 2a and is pressed backward, for example, by the inspection apparatus, the support block 100 (or the inspection-side support body 2, the electrode-side support body 3, and the connecting members 4) relatively moves toward the electrode body 6 against the biasing force of the biasing parts 14, as illustrated in FIG. 7. At this time, the front surface of the electrode-side support body 3 is away from the regulating plate 47.

Then, the back ends 5f of the contactors 5 are pressed forward by the respective electrodes 7. This causes the tips 5e of the contactors 5 to project from the facing surface 2a. FIG. 7 illustrates a state in which the tips of the contactors 5 project from the facing surface 2a, in order to provide an easy explanation. If the tips 5e of the contactors 5 project from the facing surface 2a, the tips 5e abut on and are stopped by the inspection points of the inspection circuit board. Thus, the intermediate parts of the contactors 5 with an inclined posture between the inspection-side support body 2 and the electrode-side support body 3 are warped (or bent).

If the support bloc 100 moves relatively to the frame 40 until the back surface of the electrode-side support body 3 abuts on the front surface of the electrode body 6, the support block 100 adopts the inspection posture (FIG. 7). When a warp amount of the intermediate parts of the contactors 5 is a predetermined amount, the tips 5e of the contactors 5 accommodated in the inspection guide holes 13 are brought into contact with the inspection points with predetermined contact pressure.

As described above, in the inspection posture, with the backward movement of the support block, the contactors which are about to project from the facing surface 2a abuts on the inspection circuit board A. While the tips 5e are guided to inspection positions in the inspection guide holes 13 with the intermediate parts of the contactors 5 warped, the tips 5e are brought into elastic contact with the inspection points by elastic force of the contactors 5.

Then, in transition from the standby posture to the inspection posture, the regulating plate 9 (or the first regulating members K11 and K12, and the second regulating members K21 and K22) does not prevent the backward movement of the support block 100 due to narrowing and shrinkage deformation of the first slits S11, S12, S13 and S14 and the second slits S21, S22, S23 and S24.

On the other hand, in transition from the standby posture to the inspection posture, the regulating plate 9 (or the first regulating members K11 and K12, and the second regulating members K21 and K22) has the regulation of the deformation in the first direction D1 and the second direction D2. Thus, in the inspection jig 1, the position shift of the support block 100 in the horizontal direction, i.e. the position shift of the inspection-side support body 2 in the horizontal direction, is regulated by the regulating plate 9 (or the first regulating members K11 and K12, and the second regulating members K21 and K22) when the posture of the support block 100 changes from the standby posture to the inspection posture. This results in the reduction in position shift of the relative position of the inspection-side support body 2 to the inspection circuit board A. It is therefore possible to improve the positioning accuracy of the contactors 5 which are in contact with the inspection circuit board A.

Moreover, in the inspection posture, mounting positions of the regulating plate 9 on the frame 40 and the inspection-side support body 2 are set to flatten the regulating plate 9 (FIG. 7). By this, the regulating plate 9 is set flat, i.e. in a non-deformation state, when the contactors 5 are brought into contact with the inspection circuit board A to perform the inspection. The regulating plate 9 has less distortion in the non-deformation state than in a deformation state, and thus has high positioning accuracy of the support block 100 in the horizontal direction. Therefore, in the inspection posture, the positioning accuracy upon inspection can be further improved by flattening the regulating plate 9.

FIGS. 8A to 8D and FIG. 9 to FIG. 11 are explanatory diagrams illustrating results of experiments for confirming an effect of the regulating plate 9. FIG. 8A to FIG. 8D are explanatory diagrams illustrating dents caused by the contact of the tips 5e of the contactors 5 with pads (or inspection points) formed on the inspection circuit board A if the inspection circuit board A is repeatedly attached and detached (or pressed) to the inspection-side support body 2 by using the inspection jig 1 illustrated in FIG. 1.

Figures 8A, 8B, 8C, 8D:
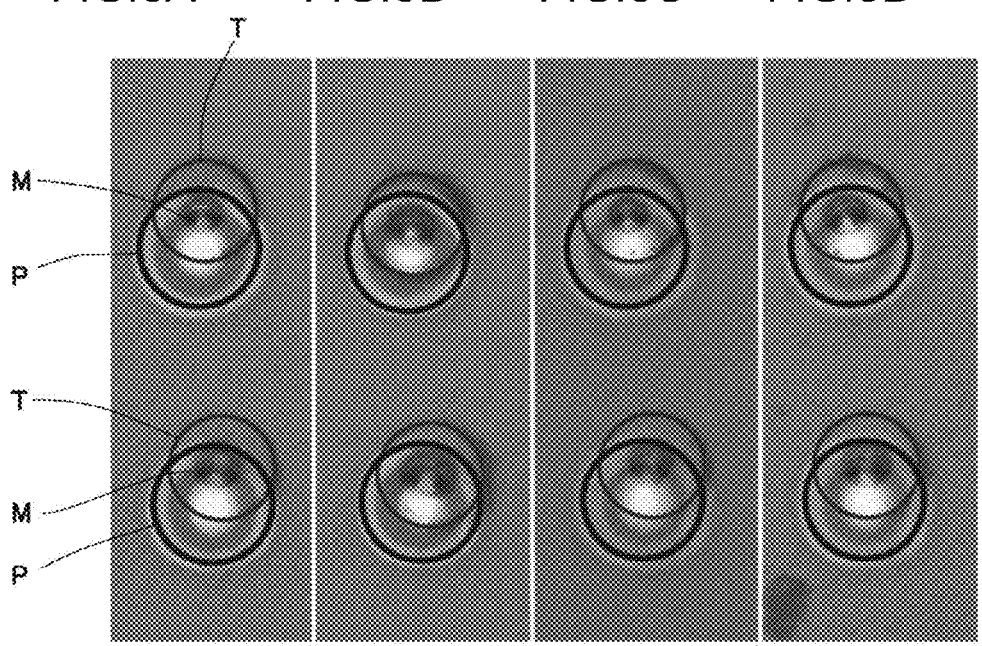
FIG. 8A to FIG. 8D are explanatory diagrams illustrating a result of an experiment for confirming an effect of the regulating plate illustrated in FIG. 1.
Figure 11:
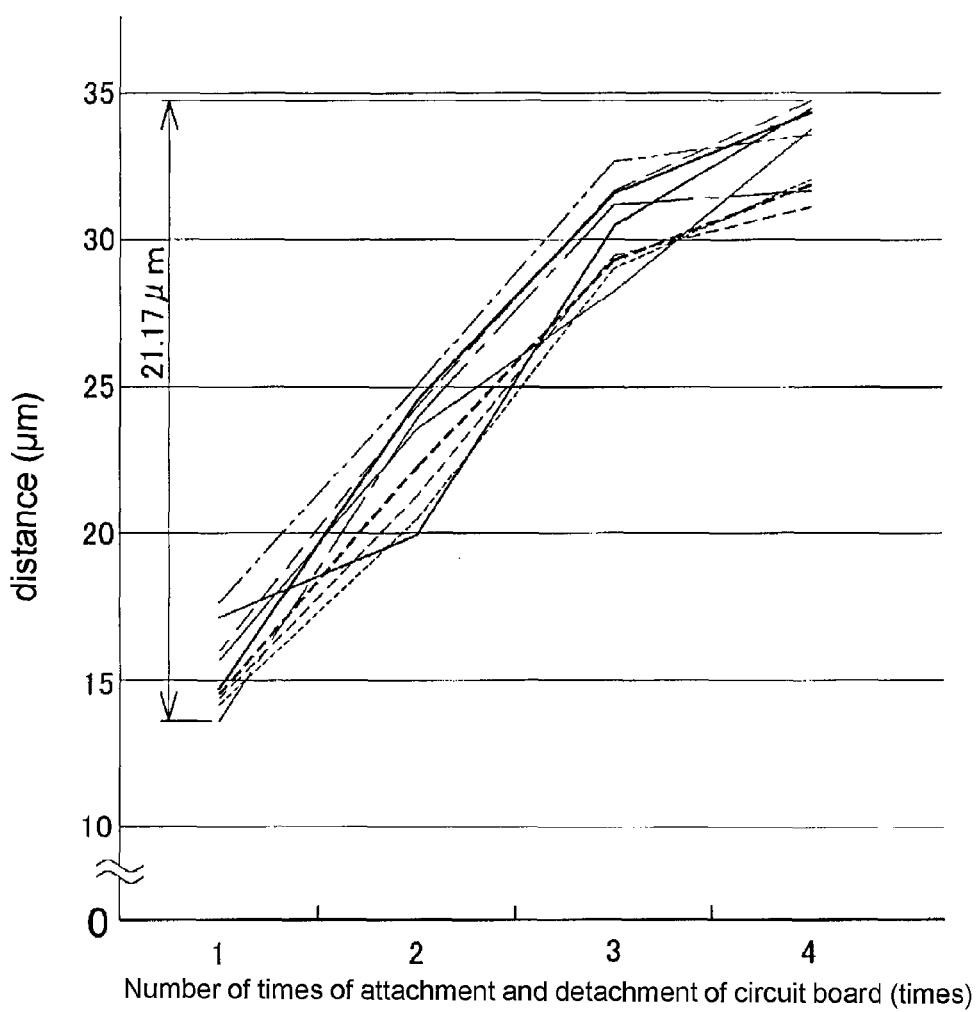
FIG. 11 is an explanatory diagram illustrating a result of an experiment without the regulating plate illustrated in FIG. 1.

FIG. 8A illustrates a result of first pressing of the inspection circuit board A to the facing surface 2a, FIG. 8B illustrates a result of second pressing of the inspection circuit board A to the facing surface 2a, FIG. 8C illustrates a result of third pressing of the inspection circuit board A to the facing surface 2a, and FIG. 8D illustrates a result of fourth pressing of the inspection circuit board A to the facing surface 2a.

In FIG. 8A to FIG. 8D, a pad P is an inspection point of the inspection circuit board A, a dent M is a dent caused by the contact of the tip 5e with the pad P, and a measurement circle T is a measurement circle which surrounds the dent M to evaluate the position of the dent M. From FIG. 8A to FIG. 8D, it is confirmed, thanks to the inspection jig 1, that there is little change in position shift of the dent M due to the number of times of the attachment and detachment, that there is a small variation in contact positions of the contactors 5 with the inspection points, and thus that the positioning accuracy of the contactors which are in contact with the circuit board is high.

FIG. 9 is a graph illustrating a result of measurement of a shift amount (or a distance from the center of the pad P to the center of the measurement circle T) when the number of times of attachment and detachment is 1 to 4 times. A horizontal axis indicates the number of times of attachment and detachment of the inspection circuit board A, and a vertical axis indicates the shift amount (μm).

According to FIG. 9, the position shift of the dent M by the inspection jig 1 is at most 9.34 μm.

FIG. 10A to FIG. 10D and FIG. 11 illustrate results of the same experiments as those in FIGS. 8A to 8D and FIG. 9 if the regulating plate 9 is removed from the inspection. According to FIG. 10A to FIG. 10D and FIG. 11, the position shift of the dent M is clearly larger than FIGS. 8A to 8D and FIG. 9. Moreover, according to FIG. 11, the position shift of the dent M is at most 21.17 μm, which is twice or more times the position shift amount by the inspection jig 1 using the regulating plate 9.

By this, it is experimentally confirmed that the inspection jig 1 provided with the regulating plate 9 can improve the positioning accuracy of the contactors 5 which are in contact with the inspection circuit board A.

It is exemplified that the regulating plate 9 is flat when having the inspection posture; however, the regulating plate 9 may be flat when having the standby posture, or the regulating plate 9 may be deformed when having both the inspection posture and the standby posture.

It is also exemplified that the first slit and the second slit are communicated to form the L-shaped slit; however, the first slit and the second slit may be separated and may not necessarily form the L-shaped slit. Nevertheless, the formation of the L-shaped slit is preferable in that it facilitates expansion and contraction in a front-back direction (or vertical direction).

It is also exemplified that the first regulating members K11 and K12 and the second regulating members K21 and K22 are made of one regulating plate 9; however, each of the first regulating members K11 and K12 and the second regulating members K21 and K22 may be made of an independent plate-like member. Moreover, there may be one first regulating member and one second regulating member, or there may be three or more first regulating members and three or more second regulating members.

It is also exemplified that two slits are arranged in parallel in each of the first regulating members and the second regulating members; however, the number of the slits formed in each of the first regulating members and the second regulating members may be one, or three or more. Nevertheless, the plurality of slits formed in each of the first regulating members and the second regulating members are preferable in that they facilitate the expansion and compression of the first regulating members and the second regulating members.

Moreover, each of the first regulating members and the second regulating members can use anything that has elasticity and that has regulation of deformation in a direction crossing an expansion and compression direction, and is not necessarily the member obtained by forming the slit(s) in the plate-like member.

The second regulating member may not be provided. Even only the first regulating member can regulate the position shift in the first direction D1 and thus can improve the positioning accuracy of the contactors 5 which are in contact with the inspection circuit board A. The provision of the first regulating member and the second regulating member is, however, more preferable in that they can regulate the position shift in the first direction D1 and the second direction D2.

Moreover, the support block 100 is not necessarily limited to being provided with the inspection-side support body 2, the electrode-side support body 3 and the connecting parts 4. For example, the front surface of the electrode-side support body 3 may be used as the facing surface 2a.

While the disclosure has been particularly shown and described with reference to specific embodiments, it should be understood by those skilled in the art that various changes in form and detail may be made therein without departing from the spirit and scope of the disclosure as defined by the appended claims. The scope of the disclosure is thus indicated by the appended claims and all changes which come within the meaning and range of equivalency of the claims are therefore intended to be embraced.

DESCRIPTION OF REFERENCE NUMERALS AND LETTERS 1 inspection jig
2 inspection-side support body
2a facing surface
3 electrode-side support body
4 connecting member
5 contactor
6 electrode body
7 electrode
9 regulating plate
13 inspection guide hole
14 biasing part
18 spacer
20 electrode guide hole
40 frame
41 base
42 wall
100 support block
A inspection circuit board
D extending direction
D1 first direction
D2 second direction
H1 first side
H2 second side
H3 third side
H4 fourth side
K11, K12 first regulating member
K21, K22 second regulating member
L1, L2, L3, L4 L-shaped slit
P pad (inspection point)
S inner space
S11, S12, S13, S14 first slit
S21, S22, S23, S24 second slit

What is claimed is:

1. An inspection jig for electrically connecting inspection points which are disposed on an inspection circuit board as an inspection object and an inspection apparatus which inspects the inspection circuit board, said inspection jig comprising:
   a frame;
   an electrode body comprising electrodes electrically connected to the inspection apparatus;
   conductive contactors having a wire shape;
   a support block having a facing surface opposite to which the inspection circuit board is disposed, guiding one ends of the contactors to the inspection points of the inspection circuit board mounted on the facing surface, guiding other ends of the contactors to the electrodes, and configured to move relatively to the frame in a moving direction which crosses the facing surface;
   biasing parts configured to bias the support block in a direction moving away from the electrode body and to the inspection circuit board; and
   a first regulating member disposed between the support block and the frame so as to extend in an extending direction directed from the support block to the frame, having elasticity, and having regulation of deformation in a first direction which is parallel to the facing surface and which crosses the extending direction,
   wherein the first regulating member comprises a first slit extending in the first direction.

2. The inspection jig according to claim 1, wherein the first regulating member is a plate-like member which has flexibility.

3. The inspection jig according to claim 2, wherein a plurality of first slits are formed in the first regulating member.

4. The inspection jig according to claim 1, further comprising a second regulating member disposed between the support block and the frame so as to extend in the first direction, having elasticity, and having regulation of deformation in a second direction which is parallel to the facing surface and which crosses the first direction.

5. The inspection jig according to claim 4, wherein the second regulating member is a plate-like member which has flexibility and in which a second slit extending in the second direction is formed.

6. The inspection jig according to claim 5, wherein a plurality of second slits are formed in the second regulating member.

7. The inspection jig according to claim 1, wherein
   said inspection jig comprises a second regulating member disposed between the support block and the frame so as to extend in the first direction, having elasticity, and having regulation of deformation in a second direction which is parallel to the facing surface and which crosses the first direction,
   the support block is disposed to be surrounded by the frame on a flat surface parallel to the facing surface and to have an interval between a peripheral part of the support block and the frame,
   the first and second regulating members are made of a plate-like regulating plate which is disposed substantially parallel to the facing surface, which has openings through which the contactors can pass, and which has flexibility,
   a central side of the regulating plate is fixed to the support block, and a peripheral side of the regulating plate is fixed to the frame,
   a first slit extending in the first direction and a second slit extending in a direction which crosses the first direction are formed in the regulating plate in a space between the peripheral part and the frame, and
   a vicinity of the first slit of the regulating plate is the first regulating member and a vicinity of the second slit of the regulating plate is the second regulating member.

8. The inspection jig according to claim 7, wherein
   the support block has a cross section in a substantially rectangular shape which is parallel to the facing surface, and has first and second sides extending in the first direction, and third and fourth sides extending in the second direction,
   the regulating plate has two first slits arranged in parallel in a space between the frame and the first side, two first slits arranged in parallel in a space between the frame and the second side, two second slits arranged in parallel in a space between the frame and the third side, and two second slits arranged in parallel in a space between the frame and the fourth side,
   one of the two first slits between the frame and the first side and one of the two second slits between the frame and the third side are communicated to form a substantially L-shaped slit, the other second slit between the frame and the third side and one of the two first slits between the frame and the second side are communicated to form a substantially L-shaped slit, the other first slit between the frame and the second side and one of the two second slits between the frame and the fourth side are communicated to form a substantially L-shaped slit, and the other second slit between the frame and the fourth side and the other first slit between the frame and the first side are communicated to form a substantially L-shaped slit.

9. The inspection jig according to claim 7, wherein
   the support block is configured to adopt:
      a standby posture in which the support block is separated from the electrode body by a biasing force of the biasing parts; and
      an inspection posture obtained by being displaced in the moving direction from the standby posture against the biasing force of the biasing parts, and
   the regulating plate is flat when the support block has the inspection posture.

10. The inspection jig according to claim 1, wherein
    the support block comprises:
       an inspection-side support body having the facing surface opposite to which the inspection circuit board is disposed, and having inspection guide holes through which the contactors are inserted and which guide the one ends of the contactors to the inspection points of the inspection circuit board mounted on the facing surface;
       an electrode-side support body having electrode guide holes through which the contactors are inserted and which guide the other ends of the contactors to the electrodes; and
       connecting members configured to arrange and hold the inspection-side support body and the electrode-side support body with a predetermined interval therebetween.

11. An inspection jig for electrically connecting inspection points which are disposed on an inspection circuit board as an inspection object and an inspection apparatus which inspects the inspection circuit board, said inspection jig comprising:

a frame;

an electrode body comprising electrodes electrically connected to the inspection apparatus;

conductive contactors having a wire shape;

a support block having a facing surface opposite to which the inspection circuit board is disposed, guiding one ends of the contactors to the inspection points of the inspection circuit board mounted on the facing surface, guiding other ends of the contactors to the electrodes, and configured to move relatively to the frame in a moving direction which crosses the facing surface;

biasing parts configured to bias the support block in a direction moving away from the electrode body and to the inspection circuit board; and a first regulating member disposed between the support block and the frame so as to extend in an extending direction directed from the support block to the frame, having elasticity, and having regulation of deformation in a first direction which is parallel to the facing surface and which crosses the extending direction, wherein the first regulating member is a plate-like member which has flexibility and in which a first slit extending in the first direction is formed.

12. The inspection jig according to claim 11, wherein a plurality of first slits are formed in the first regulating member.

13. An inspection jig for electrically connecting inspection points which are disposed on an inspection circuit board as an inspection object and an inspection apparatus which inspects the inspection circuit board, said inspection jig comprising:

a frame;

an electrode body comprising electrodes electrically connected to the inspection apparatus;

conductive contactors having a wire shape;

a support block having a facing surface opposite to which the inspection circuit board is disposed, guiding one ends of the contactors to the inspection points of the inspection circuit board mounted on the facing surface, guiding other ends of the contactors to the electrodes, and configured to move relatively to the frame in a moving direction which crosses the facing surface;

biasing parts configured to bias the support block in a direction moving away from the electrode body and to the inspection circuit board;

a first regulating member disposed between the support block and the frame so as to extend in an extending direction directed from the support block to the frame, having elasticity, and having regulation of deformation in a first direction which is parallel to the facing surface and which crosses the extending direction; and a second regulating member disposed between the support block and the frame so as to extend in the first direction, having elasticity, and having regulation of deformation in a second direction which is parallel to the facing surface and which crosses the first direction.

14. The inspection jig according to claim 13, wherein the second regulating member is a plate-like member which has flexibility and in which a second slit extending in the second direction is formed.

15. The inspection jig according to claim 14, wherein a plurality of second slits are formed in the second regulating member.

16. The inspection jig according to claim 1, wherein the electrode body has a substantially rectangular parallelepiped shape.

17. The inspection jig according to claim 1, wherein the electrode body further comprises a back end surface fixed to a front surface of the base.

18. The inspection jig according to claim 1, wherein the electrode body further comprises a front end surface having the electrodes embedded therein.

19. The inspection jig according to claim 1, wherein the support block comprises an electrode-side support body having electrode guide holes through which the contactors are inserted and which guide the other ends of the contactors to the electrodes; and each respective center of the electrode guide holes is radially offset.

20. The inspection jig according to claim 1, wherein a contactor of the contactors comprises a conductive part and an insulating part; and the support block comprises a support plate configured to contact the insulating part of the contactor when the support block adopts an inspection posture.

* * * * *